May 29, 1962 V. A. DI MUCCI 3,037,131
TRANSISTOR PULSE CIRCUIT
Filed March 9, 1959 2 Sheets-Sheet 1

INVENTOR.
Vito A. Di Mucci
BY Mueller & Aichele
Attys.

TRANSISTOR PULSE CIRCUIT

Filed March 9, 1959 2 Sheets-Sheet 2

INVENTOR.
Vito A. Di Mucci
BY Mueller & Aichele
Attys.

United States Patent Office 3,037,131

Patented May 29, 1962

3,037,131

TRANSISTOR PULSE CIRCUIT

Vito A. Di Mucci, Scottsdale, Ariz., assignor to Motorola, Inc., Chicago, Ill., a corporation of Illinois Filed Mar. 9, 1959, Ser. No. 797,926
6 Claims. (Cl. 307—88.5)

This invention relates generally to pulse circuits, and more particularly to a transistor circuit for generating rectangular pulses in response to a driving wave applied thereto.

Pulse circuits and methods are applied extensively in radar, television, computing, communications and related fields of the electronics art. There are many applications in these fields where it is desirable to provide rectangular pulses having specially controlled characteristics. For example, it is sometimes desirable to convert a sinusoidal waveform into a pulse train in which the pulse period is constant. Such pulses may be utilized for marking or synchronizing purposes. One or more of the characteristics of a rectangular pulse may be modulated to represent certain information or intelligence. Thus, in pulse width modulation the duration of individual pulses is varied, and in pulse position modulation the time between the same point on successive pulses or with respect to a synchronizing pulse is varied. To be suitable for such applications the pulse generator must accurately locate the leading and trailing edges of the pulses with respect to time—that is, the pulses should be relatively "jitter-free."

Accordingly, an object of the present invention is to provide a pulse generating circuit for converting a driving waveform into substantially rectangular pulses with a minimum amount of time jitter.

Another object is to provide a pulse generating circuit with low input power requirements.

Another object is to provide a pulse generating circuit for converting a suitable input waveform into modulated rectangular pulses.

A feature of the invention is the provision of a transistor circuit utilizing regenerative feedback to convert a driving wave into rectangular pulses.

A further feature is the provision of a regenerative pulse producing circuit in which feedback is triggered by the input wave so that the pulse edges of the output accurately correspond in time with predetermined levels of the input wave, thereby minimizing time jitter.

Another feature is the provision of a pulse generating circuit which triggers at predetermined input levels to produce a pulse with fast rise and fall times such that a variation in the slope of an input wave having a fixed period will time modulate the pulse output.

The invention is illustrated in the accompanying drawings in which.

In practicing the invention there is provided a pulse generator circuit including a transistor device, an input circuit for varying the base to emitter voltage of the transistor in response to a driving wave, and a transformer for applying a strong regenerative feedback drive to the base of the transistor and for coupling a pulse output from the collector of the transistor. A bias network including a temperature compensating diode biases the transistor to saturation, and the feedback drives the transistor very rapidly through its amplification range to provide pulses having fast rise and fall times.

Figure 1:
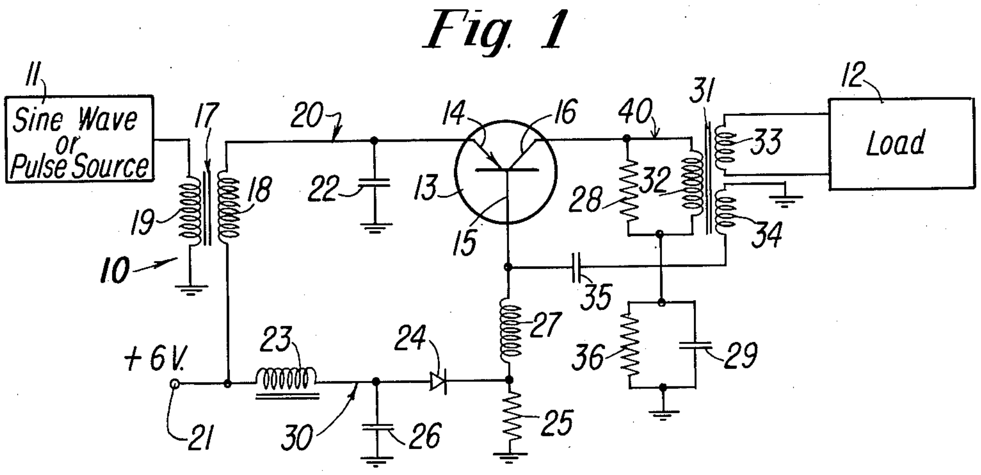
FIG. 1 is a circuit diagram for a transistor pulse generating circuit in accordance with the invention.

Referring to the drawings, the pulse generating circuit 10 of FIG. 1 is triggered by an input or driving signal applied thereto from the source 11 and responds to produce generally rectangular pulses which may be applied to a load 12. The circuit 10 will be explained with reference to the waveforms of FIG. 2 which illustrate the response of the circuit to a sine wave driving signal.

The pulse generating circuit 10 includes a transistor device 13 having an emitter electrode 14, a base electrode 15, and a collector electrode 16. The driving signal is applied to the emitter electrode 14 by an input circuit 20 including the transformer 17. Bias potential is applied across the emitter and base electrodes 14 and 15 by a network 30 including coil 23, diode 24 and resistor 25, and in the quiescent condition the transistor device is biased to saturation. Coil 23 and capacitor 26 filter the supply voltage to remove any undesirable transients which may be present. The diode 24 stabilizes the output against variation with changes in temperature. The temperature coefficients of diode 24 and the emitter to base portion of transistor 13 are equal in magnitude but opposite in effect. Any change in emitter to base voltage with variation in temperature is compensated by an opposite change in the voltage drop across diode 24, thus stabilizing the operating point of the transistor so that a pulse will be produced when the input reaches a certain level.

The output circuit 40 is coupled to the collector electrode 16 and includes a transformer 31 having a primary winding 32 and a secondary winding 33 which applies the pulse output to the load 12. Another secondary winding 34 applies regenerative feedback through capacitor 35 to the base electrode 15. The choke coil 27 isolates the bias network 30 from the feedback, and the capacitor 22 provides a path from the emitter to ground by-passing the input circuit and acts to prevent degeneration. Oscillations generated in the primary winding 32 are damped by the shunt resistor 28 as will be explained further. The resistor 36 limits the saturation current within the power dissipation specifications of the transistor, and capacitor 29 bypasses resistor 36 for output frequencies.

Figure 2:
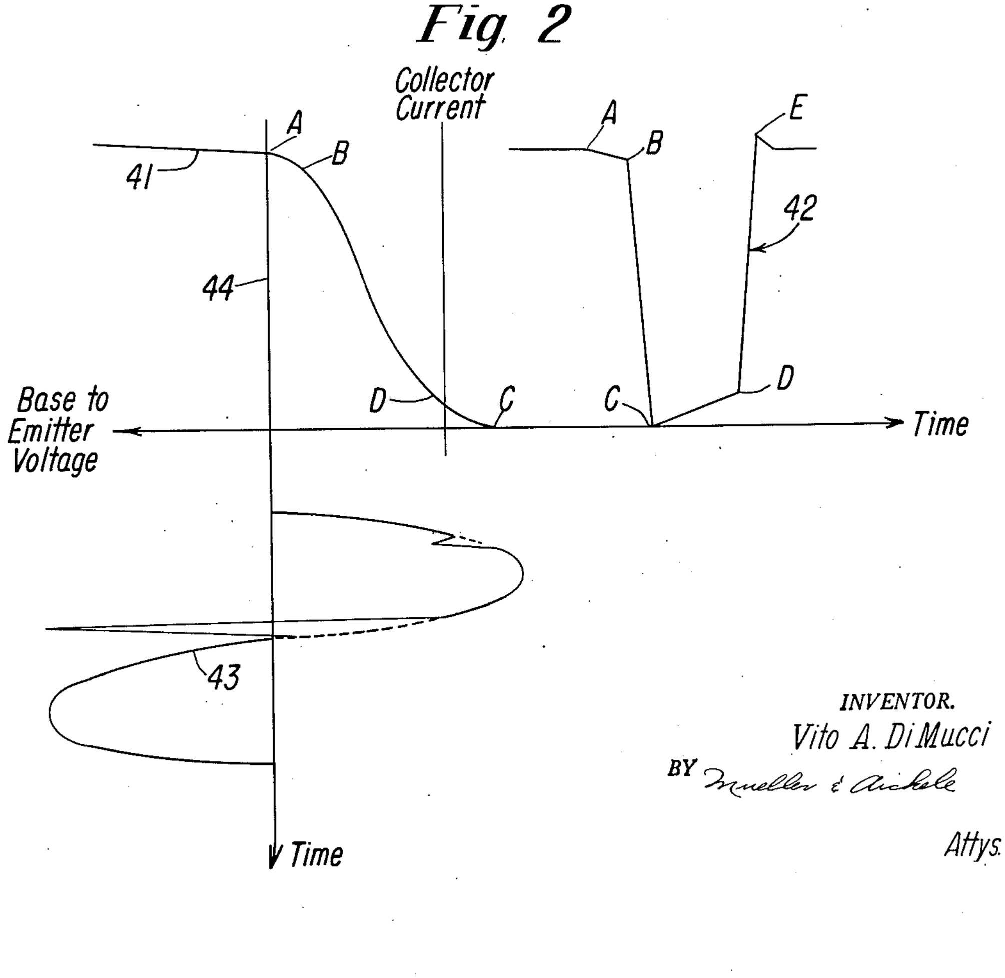
FIG. 2 shows the output waveform for the circuit of FIG. 1 corresponding to a sinusoidal input.

Referring to FIG. 2, there is shown a conduction curve 41 for the transistor device 13 of FIG. 1, and a curve 42 which represents the excursion of the collector current $I_c$ with respect to time corresponding to a sinusoidal driving function represented by the curve 43. Corresponding points on curves 41 and 42 are designated by the same reference character. The quiescent bias condition is represented by the line 44 which intersects the conduction curve 41 at point A in the saturation region. As the level of the input signal increases, the collector current slowly decreases from point A to point B on the curve 42. At this time, the transistor device 13 is in the amplification region of the conduction curve 41, and through regenerative feedback provided by the feedback winding 34 of transformer 31, the transistor is driven very rapidly from point B to point C in the cut-off region. The amplitude of the input signal 43 exceeds the conduction range of the transistor device and would be sufficient to drive the transistor to cutoff independently of the feedback, but the feedback causes the transistor to be cut off at a much faster rate so that the edge of the output pulse (points B to C) is very steep.

When the collector current is cut off, there is no current in the transformer 31 and the feedback ceases. The transistor device then tends to return to its quiescent bias condition at saturation, but by this time the level of the input signal has increased sufficiently to hold the transistor cutoff, so that the output curve 42 remains at a relatively constant level from points C to D. When the collector current reaches point D, the transistor device is again in the amplification range, and the feedback now drives the transistor through its amplification range to point E in the saturation region. Since there is no further change in the current in transformer 31 after the collector current is saturated, feedback ceases and the quiescent bias condition slowly returns. The resulting waveform 42 is a substantially rectangular current pulse in which the leading and trailing edges correspond to levels of the driving wave. The negative excursions in the driving wave 43 are reflections caused by the feedback. As the driving wave goes through repeated cycles, the pulse edges in the output will appear at exactly the same times in each cycle.

It should be noted that the input or driving wave is presented to the emitter 14 and the regenerative feedback is applied by transformer 31 from the collector 16 to the base 15. The amount of regeneration is determined by the turns ratio between windings 32 and 34 and is not affected by the input signal. Consequently, the leading and trailing edges BC and DE of the output pulse are produced at a given level of the input signal which is not affected by the amplitude of such signal, thus reducing time jitter to a minimum.

The action of the transformer 31 (FIG. 1) is an important aspect of the overall circuit operation and will be explained further. As the current through the primary coil 32 of the transformer changes in response to the applied signal as described above, the inductive voltage across the coil is proportional to the derivative of the current with respect to time. The coil 32 has substantial distributed capacitance, however, and therefore acts as a tuned circuit so that the voltage across the coil tends to oscillate at the resonant frequency of the tuned circuit. The resistor 28 acts to critically damp these oscillations and completely removes all oscillations after the initial voltage change. The inductance and distributed capacitance values of the coil 32 are chosen so that the tuned circuit has a high frequency response, and this accounts for the fast rise and fall times of the output voltage pulse.

The following values for the circuit of FIG. 1 are given by way of illustration and are not intended to limit the invention in any way.

| | |
|---|---|
| Transistor **13** | 2N114 |
| Diode **24** | S320G |
| Transformer **17** | 2:1 step down |
| Winding **18** | 24 turns |
| Winding **19** | 48 turns |
| Transformer **31**: | |
| Winding **32** | 16 turns |
| Winding **33** | 3 turns |
| Winding **34** | 6 turns |
| Coil **23** | 1.5 millihenries |
| Coil **27** | 0.5 millihenry |
| Capacitor **22** | 510 micromicrofarads |
| Capacitor **26** | 0.1 microfarad |
| Capacitor **35** | 0.1 microfarad |
| Capacitor **29** | 9 microfarads |
| Resistor **25** | 1.5 kilohms |
| Resistor **28** | 330 ohms |
| Resistor **30** | 180 ohms |

Since feedback is triggered at fixed levels of the input signal to provide the leading and trailing edges of the output pulse, the time at which these edges are produced is a function of the slope of the positive and negative swings of the input signal. This fact may be utilized to provide either a pulse width modulated output or a pulse position modulated output if desired.

Figure 3:
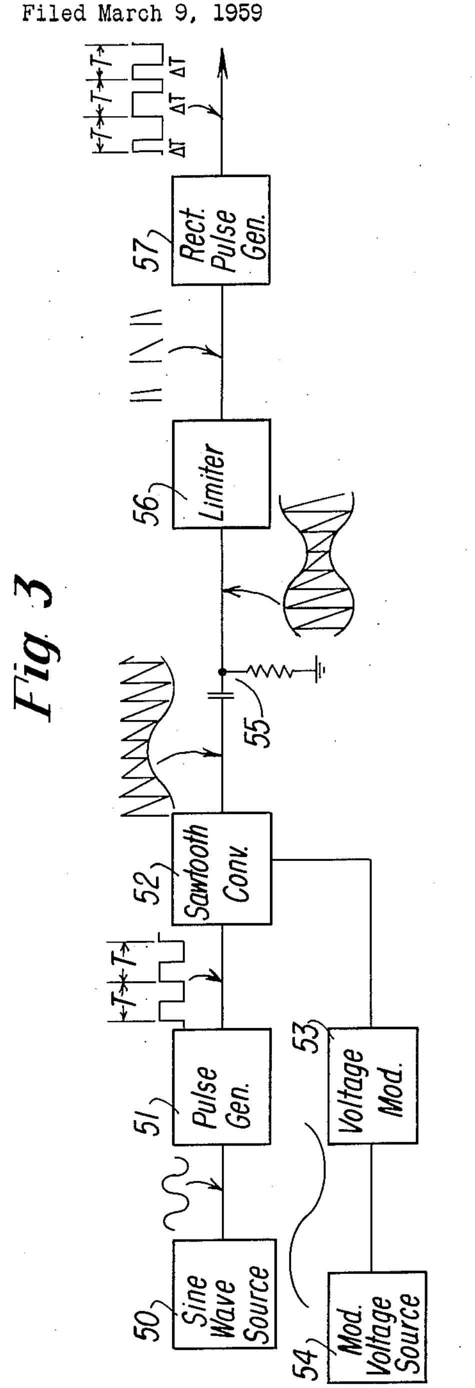
FIG. 3 shows a pulse width modulation system employing the pulse generating circuit of FIG. 1.

A pulse width modulation system is shown in FIG. 3. A pulse generator 51 is provided to convert a sine wave from the source 50 into marking pulses which have a fixed period T. The marking pulses are applied to a sawtooth converter 52. A voltage modulator 53 applies a modulating signal from the source 54 to the converter 52 so that the sawtooth output thereof is amplitude modulated as illustrated. The coupling circuit 55 removes the direct current component of the sawtooth waveform, and the limiter 56 cuts off the peaks of the resulting sawtooth wave so that the input signal which is applied to the rectangular pulse generator 57 carries the modulation information only as a change in slope of the trailing edge of the sawtooth pulses. The rectangular pulse generator 57 is provided as described in connection with FIG. 1 and converts the modulated sawtooth waveform into rectangular pulses having a constant period T, and having a pulse width $\Delta t$ which varies with the slope of the input signal applied thereto.

Figure 4:
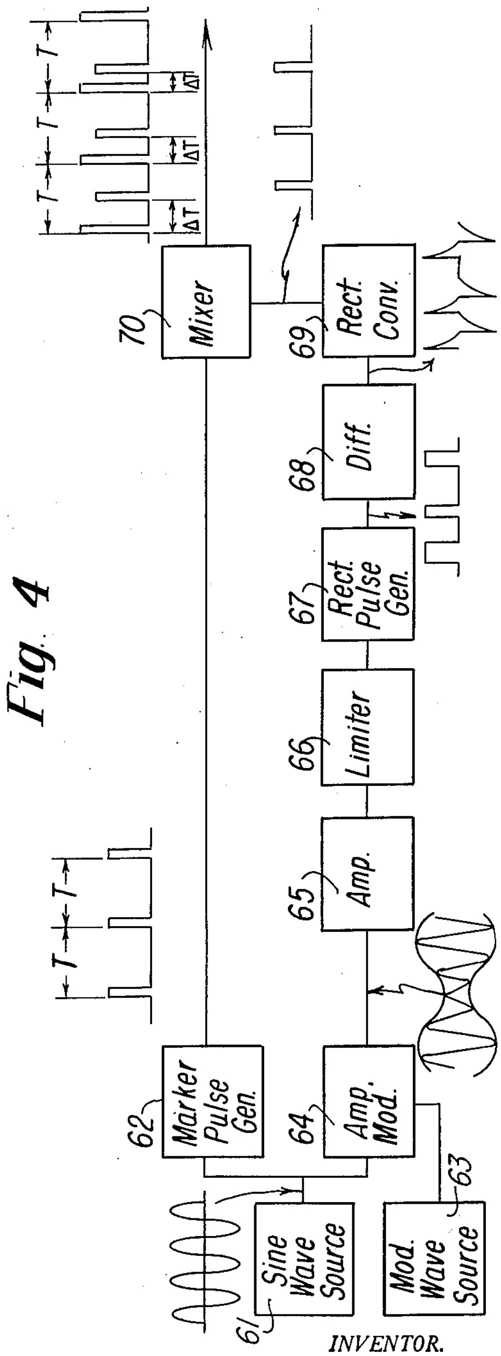
FIG. 4 shows a pulse position modulation system employing the pulse generating circuit of FIG. 1.

A pulse position modulation system is shown in FIG. 4. In a system of this type, it is desired to have the time of information pulses with respect to marking pulses vary in accordance with the modulation information in the manner illustrated by the output of the mixer 70. The marking pulses may be supplied by a pulse generator 62 which converts a sine wave from the source 61 into pulses having a fixed period T as illustrated. The source 61 may also provide the carrier wave which is combined with a modulation wave from the source 63 in the amplitude modulator 64. The resulting amplitude modulated signal as illustrated is applied through an amplifier 65 and a limiter 66 to a rectangular pulse generator 67 which is provided in accordance with the circuit of FIG. 1. The changing slope of the carrier component of the input signal causes the output of the pulse generator 67 to be time modulated as illustrated. It may be noted that the pulses in the output of generator 67 will vary somewhat in width in addition to position because both the leading and trailing edges of each pulse are time modulated. Accordingly, a differentiator 68 may be provided to separate the leading and trailing edges of each pulse as illustrated, and the resulting waveform may be reconverted into rectangular form by a rectangular converter 69. The output of the converter 69 is combined with the marking pulses in the mixer 70 to provide the pulse position modulation waveform as illustrated.

It is apparent from the foregoing description that the pulse generator of the invention may be applied wherever jitter-free pulses of fast rise and fall times are to be derived from a wave having slower rise and/or fall times. The pulse generator may be applied to provide pulse width or pulse time modulated waveforms if desired. The transistor pulse generator circuit described above is relatively simple and economical to provide, requires little input power, and is effectively stabilized against temperature variations.

I claim:

1. A pulse generating circuit including in combination, a transistor device having base, emitter, and collector electrodes, bias circuit means including a temperature compensating diode for supplying potential to said transistor device to bias the same beyond one extreme of the amplification range thereof, input circuit means coupled to said emitter electrode for applying a driving wave signal with an amplitude exceeding the said amplification range to said transistor device, output circuit means coupled to said collector electrode including a damped resonant circuit having a high frequency response, a feedback circuit for applying regenerative feedback from said resonant circuit to said base electrode to drive said transistor device very rapidly through the amplification range thereof, and isolating means coupled to said base electrode and to said bias circuit means for directing the feedback to said base electrode and isolating the feedback from said bias circuit means, whereby said pulse generating circuit is responsive to a driving wave signal having an amplitude exceeding the amplification range of said transistor device to provide a pulse output in which each pulse edge is substantially vertical and corresponds to a predetermined level of the driving wave signal.

2. A pulse generating circuit including in combination, a transistor device including base, emitter and collector electrodes, a bias circuit for supplying direct current potential to said transistor device and establishing the same at a quiescent bias condition wherein the collector current thereof is saturated, an input circuit coupled to said emitter electrode of said transistor device for applying thereto a driving wave having an amplitude exceeding the amplification range of said transistor device, output circuit means coupled to said collector electrode of said transistor device and including a tuned circuit having a high resonant frequency and a low Q factor for providing a critically damped high frequency response, a feedback circuit coupled between said tuned circuit and said base electrode for applying regenerative feedback from said tuned circuit to said base electrode, with such feedback driving said transistor device very rapidly to cut off on a swing of the driving wave in one direction and driving said device very rapidly to saturation on a swing of the driving wave in the opposite direction, and choke coil means coupled to said base electrode and to said bias circuit for directing the feedback to said base electrode and isolating said bias circuit from the feedback, whereby said output circuit means provides a pulse output having steep pulse edges corresponding in time with predetermined levels of the driving wave.

3. A pulse generating circuit including in combination, a transistor device having base, emitter and collector electrodes, bias circuit means for supplying potential to said transistor device to bias the same to saturation, transformer means having a primary winding coupled to said collector electrode, said primary winding providing a tuned circuit having a high resonant frequency, said transformer means further having a secondary winding coupled to said base electrode for applying regenerative feedback from said primary winding to said base electrode so that the initial voltage rise of an oscillation in said primary winding will drive said transistor device very rapidly through the amplification range thereof, means for damping oscillations in said primary winding after the initial voltage rise thereof, and input circuit means coupled to said emitter electrode for applying to said emitter electrode a driving wave signal of an amplitude exceeding the amplification range of said transistor device to provide a pulse output wherein each pulse edge is substantially vertical and corresponds to a predetermined level of the driving wave signal.

4. A pulse generating circuit including in combination, a transistor device having base, emitter and collector electrodes, bias circuit means for supplying potential to said transistor device to bias the same to saturation, said bias circuit including a temperature compensating diode for stabilizing the operating point of said transistor device against variation with temperature change, an input transformer coupled to said emitter electrode for applying to said transistor device a driving wave having an amplitude exceeding the amplification range of said transistor device, a capacitor providing a bypass path from said emitter electrode to a point of reference potential for minimizing degeneration in said input circuit, an output transformer with a primary winding having a high resonant frequency coupled to said collector electrode for providing a high frequency response, resistance means shunting said primary winding of said output transformer for damping the frequency response thereof, said output transformer including a secondary winding coupled to said base electrode for applying regenerative feedback to said transistor device so that the initial voltage rise of an oscillation in said primary winding will drive said transistor device through the amplification range thereof in opposite directions responsive to swings of the driving wave in opposite directions, and said output transformer further including a tertiary winding for providing a pulse output having substantially vertical pulse edges corresponding in time with predetermined levels of the driving wave, and choke coil means coupled to said base electrode and to said bias circuit means for isolating said bias circuit means from the feedback and thereby steering the feedback to said base electrode.

5. A pulse generating circuit including in combination, a transistor device having an input electrode, an output electrode and a control electrode, bias circuit means for supplying potential to said transistor device effective to bias the same to saturation, input circuit means coupled to said input electrode for applying a driving signal to said transistor device to provide a time-varying driving wave having an amplitude exceeding the transistor amplification range, output circuit means coupled to said output electrode including a critically damped resonant circuit having a high frequency response for supplying a rectangular pulse output from said transistor device, and a feedback circuit coupled between said output circuit and said control electrode for applying regenerative feedback to said control electrode to drive said transistor device through the amplification range thereof, whereby said pulse generating circuit is responsive to the driving signal to provide at said output circuit means a pulse output with steep pulse edges which correspond in time to a predetermined level of the driving signal and which are otherwise substantially independent of the amplitude of the driving signal.

6. In a pulse modulation system which includes means supplying an amplitude modulated signal, a pulse generating circuit receiving the modulated signal and responsive thereto to supply a time modulated rectangular pulse output, said pulse generating circuit including in combination, a transistor device having an input electrode, an output electrode and a control electrode, bias circuit means for supplying potential to said transistor device effective to bias the same to saturation, input circuit means coupled to said input electrode for applying the amplitude modulated signal to said transistor device, output circuit means coupled to said output electrode including a critically damped resonant circuit having a high frequency response for supplying a rectangular pulse output from said transistor device, and a feedback circuit coupled between said output circuit and said control electrode for applying regenerative feedback to said control electrode to drive said transistor device through the amplification range thereof, whereby said pulse generating circuit is responsive to the amplitude modulated signal to provide at said output circuit means a pulse output with steep pulse edges which correspond in time to a predetermined level of the amplitude modulated signal and which are otherwise substantially independent of the amplitude of the amplitude modulated signal.

References Cited in the file of this patent

UNITED STATES PATENTS

| | | |
|---|---|---|
| 2,400,909 | Birss | May 28, 1946 |
| 2,485,591 | Grieg | Oct. 25, 1949 |
| 2,590,836 | Andrews | Apr. 1, 1952 |
| 2,672,558 | Fischman | Mar. 16, 1954 |
| 2,673,330 | Scott | Mar. 23, 1954 |
| 2,703,368 | Wrathall | Mar. 1, 1955 |
| 2,774,888 | Trousdale | Dec. 18, 1956 |
| 2,797,267 | Yost | June 25, 1957 |
| 2,802,071 | Lin | Aug. 6, 1957 |
| 2,843,743 | Hamilton | July 15, 1958 |
| 2,847,569 | Finkelstein | Aug. 12, 1958 |
| 2,878,440 | Jones | Mar. 17, 1959 |

FOREIGN PATENTS

| | | |
|---|---|---|
| 134,759 | Australia | Oct. 19, 1949 |

OTHER REFERENCES

"Pulse and Digital Circuits" by Millman and Taub, 1956, published by McGraw-Hill, N.Y. pages 587–588, chapter 9. (Relied on pages 270 to 274.)

Shea Transistor Circuit Engineering, John Wiley and Sons, N.Y., 1958 (page 281 relied on).